(12) United States Patent
Blosser et al.

(10) Patent No.: US 7,369,951 B2
(45) Date of Patent: May 6, 2008

(54) DIGITAL, SELF-CALIBRATING PROXIMITY SWITCH

(75) Inventors: Stephen R. Blosser, Lansing, MI (US); John B. Eulenberg, East Lansing, MI (US)

(73) Assignee: Board of Trustees of Michigan State University, East Lansing, MI (US)

( * ) Notice: Subject to any disclaimer, the term of this patent is extended or adjusted under 35 U.S.C. 154(b) by 409 days.

(21) Appl. No.: 11/067,484

(22) Filed: Feb. 25, 2005

(65) Prior Publication Data

US 2005/0209828 A1    Sep. 22, 2005

Related U.S. Application Data

(60) Provisional application No. 60/548,245, filed on Feb. 27, 2004.

(51) Int. Cl.
*G06F 17/00* (2006.01)
(52) U.S. Cl. .................... 702/74; 702/79; 702/193; 434/112
(58) Field of Classification Search ............. 702/74, 702/79, 193
See application file for complete search history.

(56) References Cited

U.S. PATENT DOCUMENTS

| | | | | |
|---|---|---|---|---|
| 6,542,081 | B2 * | 4/2003 | Torch | 340/575 |
| 6,636,763 | B1 * | 10/2003 | Junker et al. | 600/545 |
| RE39,539 | E * | 4/2007 | Torch | 340/575 |
| 2004/0044293 | A1 * | 3/2004 | Burton | 600/544 |
| 2004/0044418 | A1 * | 3/2004 | Goldstein | 700/1 |

OTHER PUBLICATIONS http://web.archive.org/web/20031205150250/http://www.msu.edu/unit/artlang/SCATIR.ht; "The SCATIR Switch" (Jan. 2003).

* cited by examiner

*Primary Examiner*—Hal Wachsman
(74) *Attorney, Agent, or Firm*—Harness, Dickey & Pierce, P.L.C.

(57) ABSTRACT

A signal processing system for detecting purposive signals includes an input receiving a signal having a signal characteristic subject to user manipulation. An activation detector compares a property of the signal characteristic to one or more signal characteristic property thresholds over time. A filter module determines whether the signal characteristic is purposively manipulated based on an amount of time preceding or following an occurrence of the property exceeding or falling below one or more signal characteristic property thresholds.

21 Claims, 12 Drawing Sheets

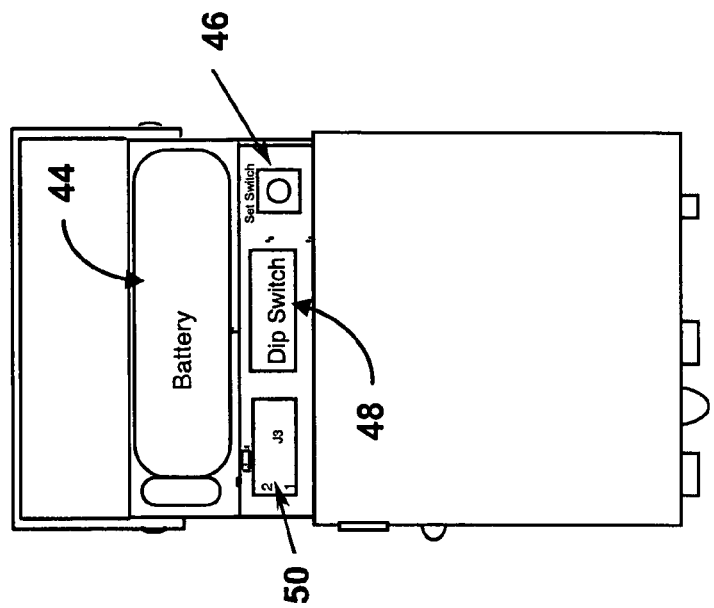
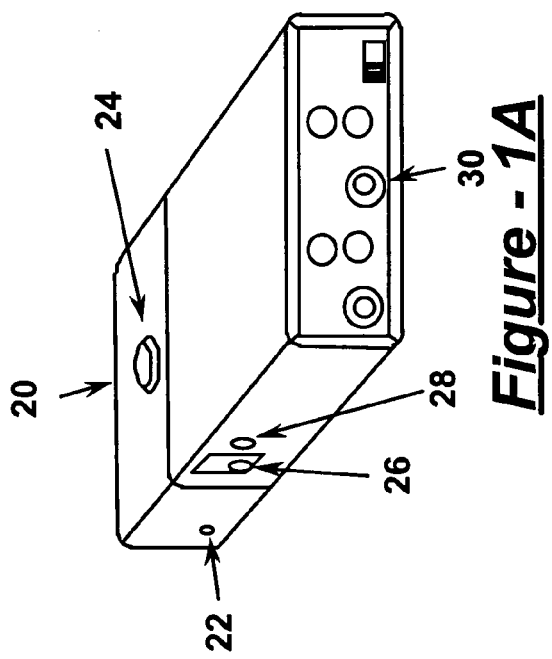
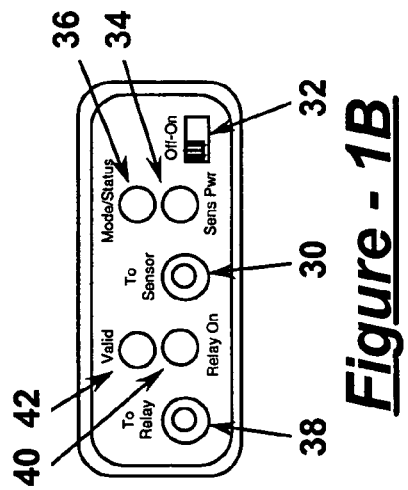

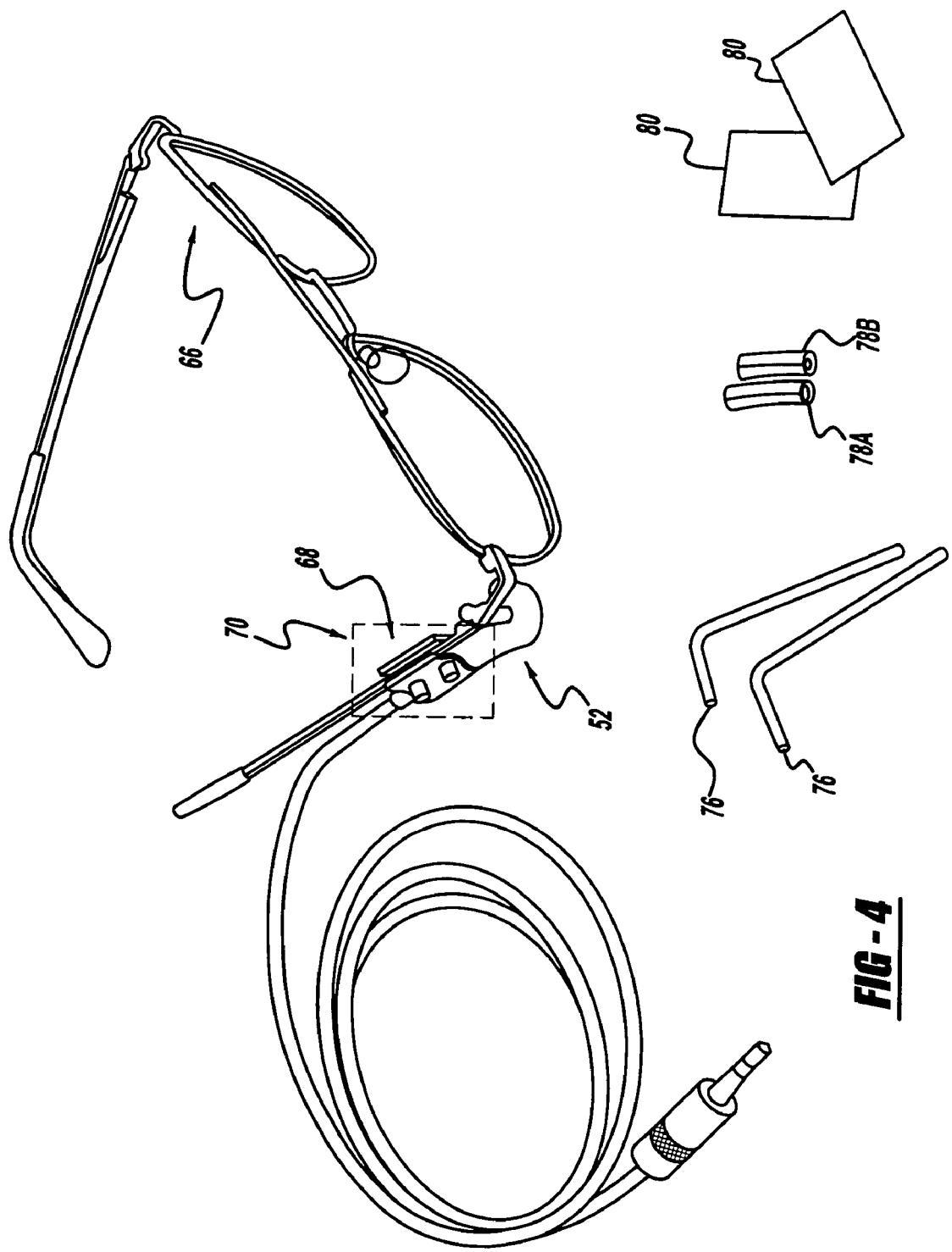

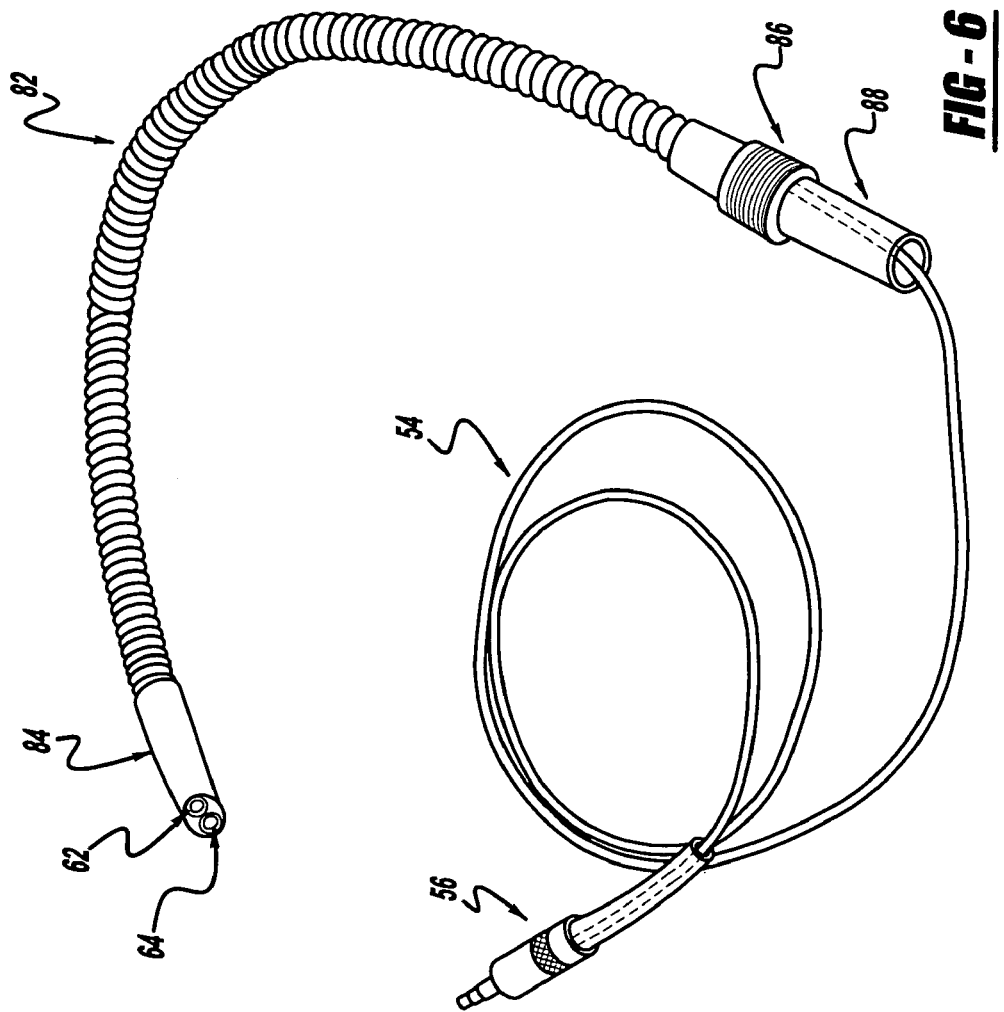
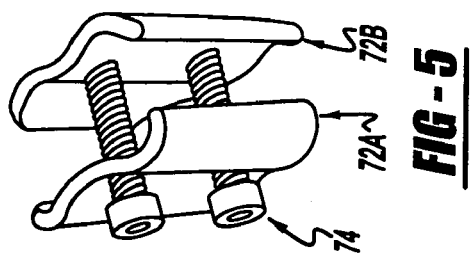

DIGITAL, SELF-CALIBRATING PROXIMITY SWITCH

CROSS-REFERENCE TO RELATED APPLICATIONS

This application claims the benefit of U.S. Provisional Application No. 60/548,245, filed on Feb. 27, 2004. The disclosure of the above application is incorporated herein by reference in its entirety for any purpose.

FIELD OF THE INVENTION

The present invention generally relates to proximity switches, and particularly relates to a signal processing unit capable of distinguishing between purposive and non-purposive signals.

BACKGROUND OF THE INVENTION

A typical proximity switch consists of a sensor, a signal-processing unit, and an output port. The signal-processing unit detects the distance of the sensor from the surface of a target object, the "activating surface". In prior art designs, when this distance is less than a certain magnitude, the "activation distance", the output port is switched to its "on" state.

Previous proximity switches have had either a fixed activation distance or have required manual calibration to set the activation distance. In actuality, the signal received from the sensor has an intensity that may be affected by distance, but that can also be affected by color and other environmental circumstances. An exemplary traditional use for such proximity switches is as a user interface input mechanism for physically challenged persons with limited motoric capability. A user of a previous, analog proximity switch may typically position the sensor near the eyebrow with emitted light aimed below the eyebrow when the face is in a relaxed position. Thenceforth, the user can simply lower the eyebrow into the emitted light to raise the intensity of the signal due to darker color (assuming a dark eyebrow) and greater proximity. Alternatively, a user can aim the emitted light between folds of skin beside the eye that contract during a winking movement. In this case, the intensity of reflected light raises primarily due to greater proximity.

The aforementioned techniques avoid non-purposive triggering of the switching mechanism due to some involuntary movements, such as blinking, but can be subject to non-purposive triggering due to other involuntary movements, such as tremors that can follow a purposive movement. Also, some users may have less difficulty in operating the switch merely by closing the eye, rather than winking or lowering the eyebrow. However, the target area for aiming the sensor is diminished by inability of the sensor to distinguish between mere blinks and purposive closing of the eyelid alone. Thus, the need remains for a signal processing unit that can distinguish between purposive and non-purposive signals. The present invention fulfills this need.

SUMMARY OF THE INVENTION

In accordance with the present invention, a signal processing system for detecting purposive signals includes an input receiving a signal having a signal characteristic subject to user manipulation. In another aspect of the present invention, an activation detector compares a property of the signal characteristic to one or more signal characteristic property thresholds over time. A further aspect of the present invention provides a filter module which determines whether the signal characteristic is purposively manipulated based on an amount of time preceding or following an occurrence of the property exceeding or falling below one or more signal characteristic property thresholds.

The digital switching apparatus according to the present invention affords several advantages over previous, analog switches. For example, the use of a digital controller facilitates tracking of signal characteristics over time, with implementation in software of user-adjustable filtering methods that distinguish purposive activations from non-purposive ones. Also, a self-calibrating mode is enabled by the ability to track signal characteristics over time, such that a slope can be calculated that indicates rate of change. Further, on-board memory and processing capability, combined with a variable state output mechanism, permits the implementation of on-board activation pattern recognition with distinguishable outputs to an external processor. The switching apparatus of the present invention is advantageously useable to facilitate communications and/or actuation of devices by physically challenged people. In comparison to previous, analog proximity switches, this invention allows for a more compact packaging of a working proximity switch. It can be packaged with its own power source and with easily accessed mode controls and status indicators. It can also be incorporated as a modular part of a larger system.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein:

FIG. 1A is a perspective view showing the preferred embodiment of a switching apparatus of the present invention;

FIG. 1B is a front elevational view showing the preferred embodiment of a switching apparatus of the present invention;

FIG. 1C is a top elevational view showing the preferred embodiment of the switching apparatus with various internal components revealed;

FIG. 4 is a perspective view of the proximity sensor affixed to eyeglasses employed in the preferred embodiment of the switching apparatus;

FIG. 5 is a perspective view of a clamp employed in the preferred embodiment of the switching apparatus;

FIG. 6 is a perspective view of a second preferred embodiment proximity sensor and cable employed in the present invention;

DETAILED DESCRIPTION

Figure 2:
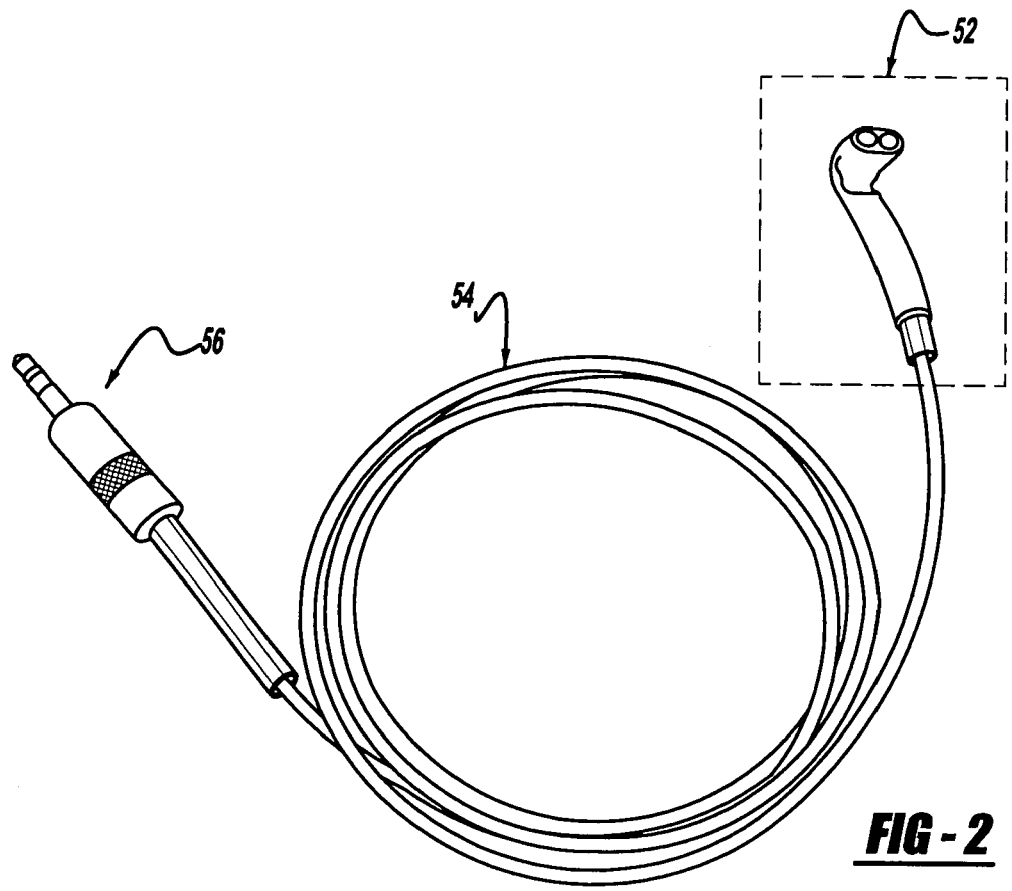
FIG. 2 is a perspective view showing a proximity sensor and cable for use with the preferred embodiment of the switching apparatus.
Figure 3:
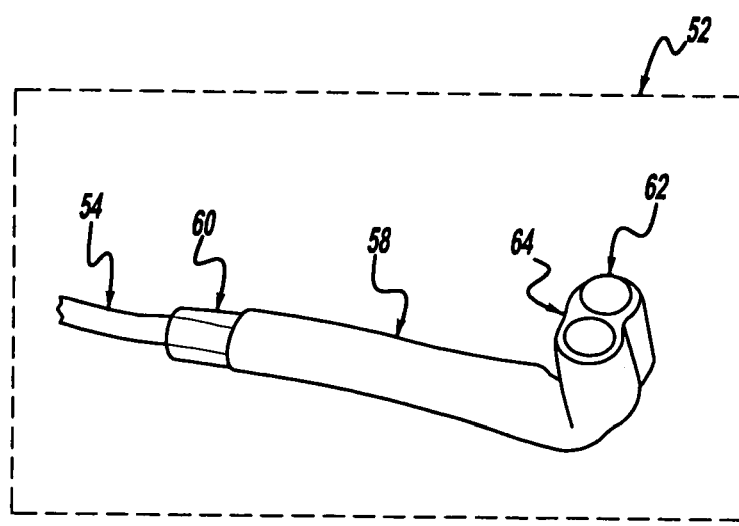
FIG. 3 is an enlarged perspective view of the proximity sensor for use with the preferred embodiment of the switching apparatus.

The following description of the preferred embodiments is merely exemplary in nature and is in no way intended to limit the invention, its application, or uses.

Referring to FIG. 1A, a preferred embodiment of a digital switching apparatus of the present invention includes a hinged cover 20 having a hinge 22 and a latch release 24. The apparatus also has a charger jack 26, a charge status LED 28, and a sensor jack 30 adapted to connect to several, optional sensor configurations, preferably via a standard tip-ring-sleeve (TRS) connection. Examples of types of sensors that can connect to sensor jack 30 include proximity sensors, EMG sensors, force sensing resistors, visible light and shadow sensors, skin conductivity sensors, capacitive touch sensors, and piezo sensors.

FIG. 1B illustrates a front panel of the switching apparatus, including sensor jack 30, a power switch 32, a "sensor power" LED 34, and a "mode/status" LED, 36. A relay jack 38 supplies an output signal to external devices, with a "relay on" LED 40 and a "valid activation" LED 42 providing user feedback relating to operation of external devices via the switching apparatus. A sound-producing mechanism (not shown) also provides similar user feedback.

FIG. 1C illustrates the switching apparatus in an open position that reveals several internal switching apparatus components. For example, a battery 44 supplies power to the switching apparatus, and a set switch 46 allows a user to set one or more thresholds, such as intensity thresholds and temporal thresholds. Also, a dip switch 48 allows the user to select one or more modes of operation for the switching apparatus, such as manual calibration versus self-calibration modes, and pattern recognition versus default operation modes. Further, program/expansion connector 50 serves as a variable state input/output device, such as a PGM serial port, and allows upload of recognition patterns and output of related pattern states upon recognition.

Turning now to FIGS. 2-5, an infrared proximity sensor 52 has a power cable 54 and a male TRS connector 56. It is preferred to employ an infrared sensor with a detector that filters out certain wavelengths of light, such as visible wavelengths. In this way, the sensor can be less susceptible to accidental activation due to rapid changes in visible light conditions, such as from fluorescent lights. A suitable 5 mm infrared sensor is commercially available from Everlight Electronics Co., Ltd., Model No. SIR333/H19/F51-R11.

An outer polyolefin layer 58 surrounding PVC tubing 60 protects sensor components, such as infrared LED 62 and photo transistor 64. Sensor 52 can be mounted to a carrier, such as under plastic wheel-chair lap trays or attached to eyeglasses 66 of a user via a clamp 68 as illustrated at 70. Stainless steel braces 72A and 72B concurrently apply pressure to eyeglass and sensor components when tightened via screws 74 according to user manipulation of wrenches 76. Strain relief tubing 78A and 78B and padding 80 serve to protect sensor 52 when situated over sensor components at points of pressure application.

Turning now to FIG. 6, a second preferred embodiment proximity sensor apparatus employs a gooseneck sensor. An adjustable positioning gooseneck 82 has a stainless steel tube 84 that holds and protects infrared LED 62 and photo transistor 64. The cable 54 having TRS connector 56 exits through a standard microphone treaded end 86. A strain relief 88 is added to protect the cable 54 from strain by preventing the cable from being pulled sharply to one side as it exits the treaded end 86.

Figure 7:
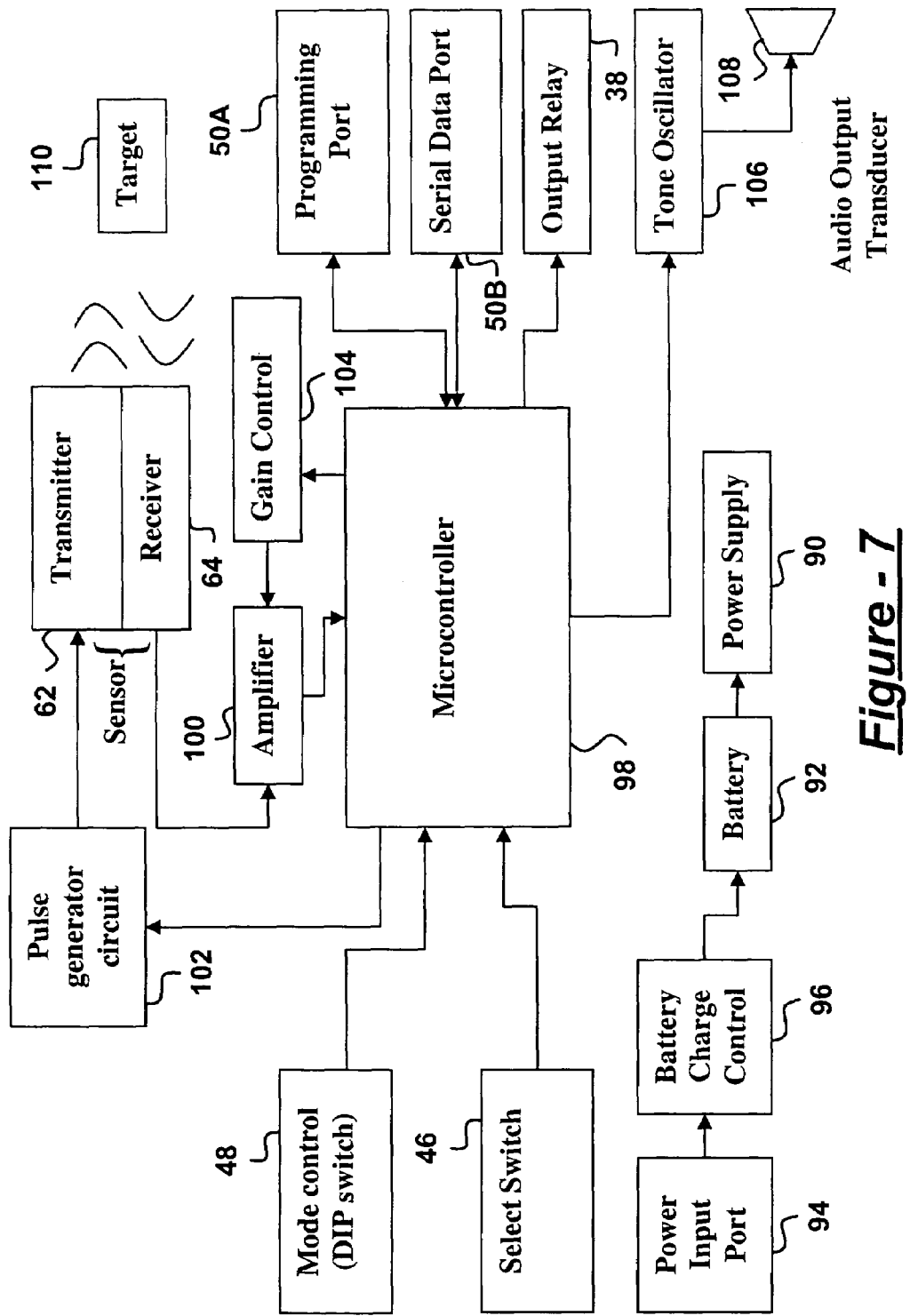
FIG. 7 is a block diagram illustrating the preferred embodiment of the switching apparatus in accordance with the present invention.

FIG. 7 illustrates several components of a high-speed sampling circuit of the switching apparatus. For example, a power supply 90 is provided by a battery 92 charged from power input port 94 according to charge control module 96. Also, a microcontroller 98, such as the PIC 16F876A flash microcontroller, communicates with several other components, including input components and output components. For example, microcontroller 98 receives signals from set switch 46, mode control switch 48, amplifier 100, and input/output ports 50A and 50B. Also, microcontroller 98 outputs signals to pulse generator 102, gain control 104, input/output ports 50A and 50B, output relay jack 38, and tone oscillator 106. In turn, tone oscillator 106 drives audio output transducer 108 to provide audio feedback to the user. Further, pulse generator drives sensor transmitter LED 62, thereby causing receiver phototransistor 64 to receive light reflected from target 110. Sensor sensitivity can be influenced by user manipulation of set switch 46 to affect gain control 104. It is envisioned that potentiometers may alternatively or additionally be utilized to adjust various thresholds of the switching apparatus, such as sensitivity.

The small surface-mount switching apparatus has a power saving sleep mode to enable extended battery operation between charges. It also contains a 10-bit analog-to-digital converter for making precision distance readings. The flash programmability allows custom user settings to be stored even when the switch is powered down. It also makes it possible to offer field-programmable firmware updates.

Figure 8A:
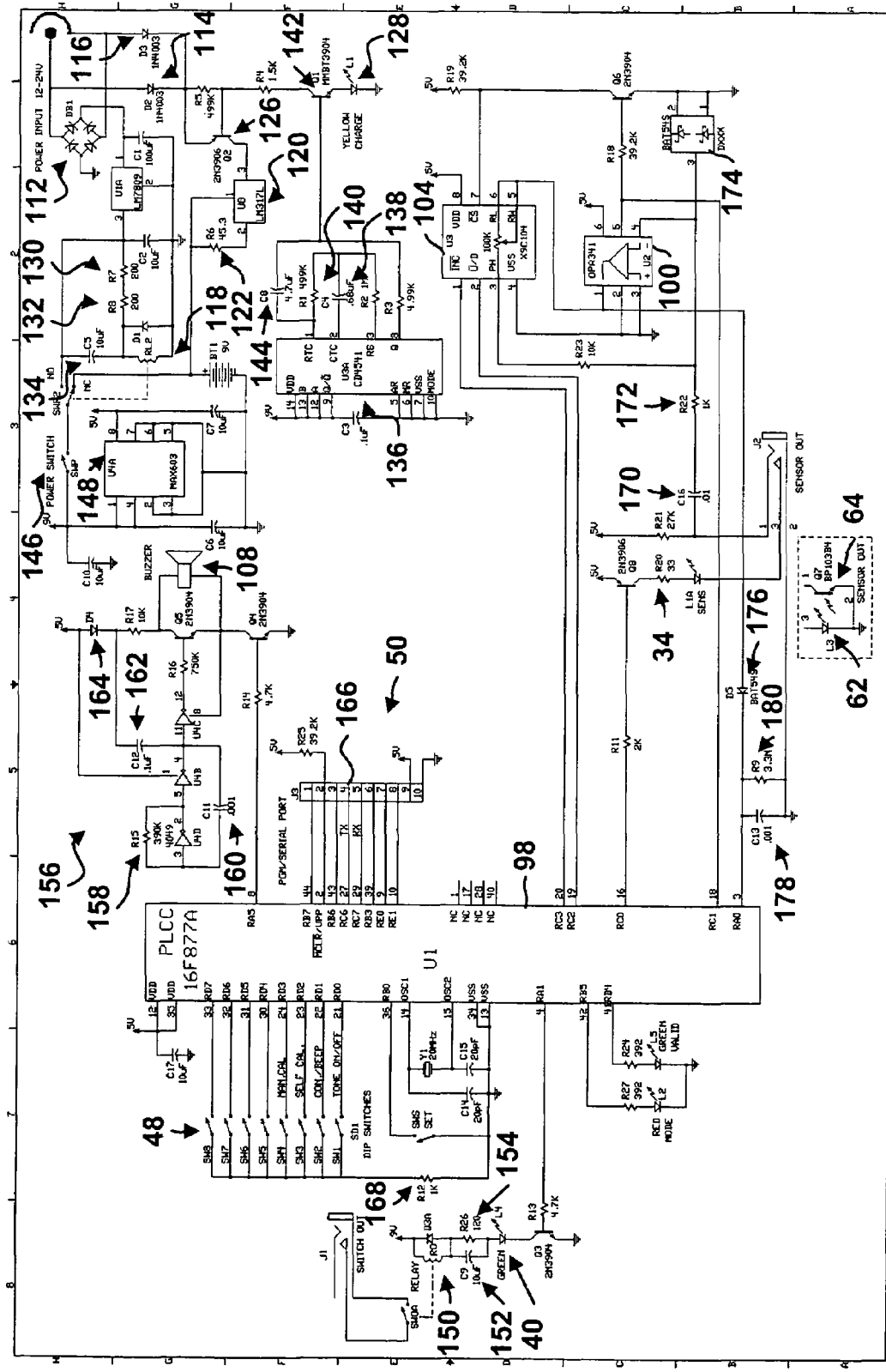
FIG. 8A is an electrical schematic of a first preferred embodiment of the switching apparatus in accordance with the present invention.

Turning now to FIG. 8A, a bridge rectifier 112 provides for any polarity or AC power input for both charging and powering the switch. Diodes 114 and 116 prevent power feedback from the battery. When external power is present, relay 118 switches the battery out of the circuit. By removing the battery from the circuit through relay 118, a more accurate charging current (28 ma) can be maintained. This charging current is regulated by voltage regulator 120 (Lm317L) and resistor 122. Resistors 130 and 132 and capacitor 134 reduce the power consumption of the coil in relay 118. The power dissipation is distributed between the small surface-mount resistors 130 and 132.

When power is first applied, the 16-bit CMOS binary counter 136 (CD4541) begins its timing cycle. The battery charging current is steady in this state and the yellow LED 128 glows continuously. Counter 136's internal 16-bit counter begins counting the oscillation of capacitor 138 and resistor 140. After one-half of this 16-bit timing cycle, pin 8 (Q) of the counter goes low. This turns off transistors 126 and 142 and stops the charging of the battery. Pin 8 will not go high again until a master reset or a new power-up occurs.

Capacitor 138 and resistor 140 continue to oscillate. This oscillation is coupled through capacitor 144 to turn on transistors 126 and 142 with very brief pulses. These pulses are visible on LED 128. These pulses help maintain the battery when left charging for extended periods. An external power switch 146 is located on the front panel of the switch apparatus enclosure, and is electronically situated between relay 118 and voltage regulator 148 (MAX603), which regulates the 9 volts to 5 volts for powering some of the switch circuitry.

Charging of the battery is completely automatic and does not require user intervention. An LED indicates the charging status, and shines steadily when charging. After charging is complete, the LED flashes on and off. This flashing also pulse-trickle charges the battery to keep it fully charged.

The Varta 9-volt nickel metal hydride (NiMH) rechargeable battery that is included with the switching apparatus has a fast charge rate of 28 ma for 7 hours. It is believed that this relatively low charging current does not produce the characteristic NiMH voltage knee (drop) that is typical at higher charging currents. This lack of detectable voltage change forces the charger design to be only current-and time-limited. It is further believed that the battery is not easily damaged by subjecting the battery to a charge time in excess of the 7 hours. Overcharging is determined only if it continues steadily for several days. Sequentially repeating two or three of the 7 hour charge cycles is not detrimental but should be avoided. This overcharging could only occur in the present design by a user purposely unplugging the charger after each 7 hour time period and restarting the charge. In this case, it would not damage the switch, but the battery would gradually lose some of its storage capacity.

The switching apparatus can be powered by any standard 9-volt rechargeable or non-rechargeable battery; the battery must be a true 9 volts, some rechargeable "9 volt" batteries are only 7.2 volts. The switch can be operated from the wall transformer without the battery installed. The wall transformer can be any polarity DC or AC voltage. Non-regulated wall transformers with voltage ratings from 12 volts to 24 volts can be used. A wheelchair battery (24 volts) can be used to operate the switch through the charger jack (J1). The charger circuit charges the 9-volt battery at the fast charge rate (7 hours to full charge). The charging current automatically shuts off after the battery is charged. An LED indicates the charging status. When lit constantly, the battery is being charged. When charging is completed the LED flashes. The battery is maintained at full charge indefinitely by these short charge pulses. In the present configuration the charger printed circuit board is configured to mount above the switch circuit board inside the enclosure.

The switch is portably powered by a single internal 9-volt rechargeable battery. This standard size battery can be replaced by most any brand 9-volt rechargeable or non-rechargeable battery. This feature allows an easy way for someone to quickly remedy a discharged battery problem. The switch can also be powered and charged by several types of external power sources connected to the charger jack. The internal circuit will power the switch in this mode with or without the battery in place. This feature enables use of the switch independent of battery condition or availability. This feature is also advantageous for powering from external power sources, such as wheelchair batteries or other power sources.

The output relay circuit 150 is shown in FIG. 8A. Using a relay to control the output insures compatibility with a wide variety of devices. The isolated contacts of the relay allow many voltage and polarity differences of the devices this switch can control. Pin RA1 of the microcontroller 98 turns the relay circuit 150 on and off. The green LED 40 provides the user with a visible feedback of the state of the relay. Capacitor 152 and resistor 154 provide power savings by reducing the current needed to hold the relay in the "on" state. The tone oscillator circuit 156 provides audio feedback to the user. A CD4049 hex inverter generates an audio signal with frequency determined by the values of resistor 158 and capacitor 160. Capacitor 162 and diode 164 form a voltage-doubling circuit to drive piezo speaker output 108.

A program/serial port 50 includes a 10-pin header 166, which provides a connection for reprogramming the microcontroller. This connector also provides the option for communicating through an external interface (USB or RS 232) to computers or other devices. This link can be used for other modes of input control, such as direct selection cursor control, mouse emulation, etc. Other controlled bits on this connector may be used for other types of communications protocols or future expansion.

DIP switch 48 is employed as a user interface device for mode selection. To save power, pull up resistors are not used with six of the seven switches comprising this component. To read each station of the switch, it is necessary to write a 1 (high) to the corresponding bit just prior to reading it. If the switch is open, it will capacitively retain its charge and will be read as a 1 (high). If the switch is closed it will be discharged through the pull-down resistor 168 and will be read as a 0 (low). One or more stations of the DIP switch 48, however, may be an open-drain input and may require a pull-up resistor.

The remaining sensor and amplifier circuitry allow distance readings with a proximity sensor connected to the apparatus. The reading of the distance can be made by sending a single pulse from the infrared LED 62 and performing an A-to-D conversion of the amplified reflecting signal from the photo transistor 64. A distance reading is initiated by pulsing bit RC0 of the microcontroller 98. FIGS. 9-13 provide related timing diagrams. The width of this pulse is typically 25 microseconds. This width can be reduced to improve close-range sensitivity. At the end of this pulse, an A to D conversion is performed. Returning to FIG.

8A, red LED 34, in series with infrared LED 62, provides the user with a visible confirmation that the switch is functioning.

Figure 10:
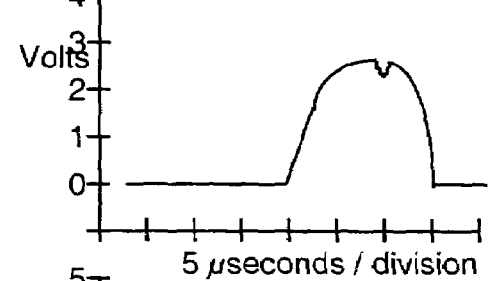
FIG. 10 is a graph of an output from an op amp of the switching apparatus with a gain setting set at maximum and a target positioned four inches from a proximity sensor in communication with the preferred embodiment of the switching apparatus.
Figure 11:
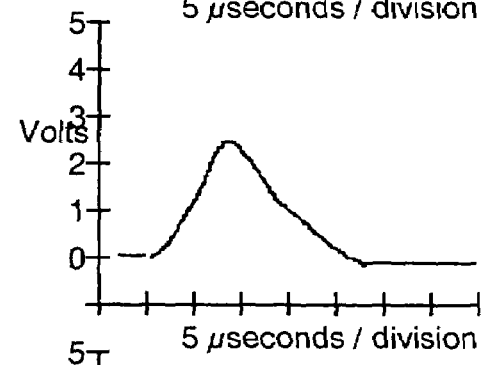
FIG. 11 is a graph of an output from an op amp of the switching apparatus with a gain setting set at minimum and a target positioned one-half inch from the proximity sensor in communication with the preferred embodiment of the switching apparatus.

The photo transistor 64 detects the reflected pulse. Capacitor 170 and resistor 172 form a high-pass filter to block environmental infrared noise. This filtered signal is amplified by op amp 100. This single-supply op amp has rail-to-rail input and output which allows its +V input to be tied to ground, forming an inverting amplifier configuration. The filtered photo transistor signal is coupled to the −V input. Schottky diodes 174 clamp this voltage to keep it within usable limits. This clamp also protects the op amp from static charges. The gain of the op amp is controlled by gain control 104, a programmable digital potentiometer. This control gives the proximity switch a range of up to 5 inches. This computer-controlled gain helps to equalize the sensitivity over the full range. Typical output signals from the op amp 100 are plotted in FIGS. 10 and 11. FIG. 10 is a graph of an output from an op amp of the switching apparatus with a gain setting set at maximum and a target positioned four inches from a proximity sensor in communication with the switching apparatus. FIG. 11 is a graph of an output from an op amp of the switching apparatus with a gain setting set at minimum and a target positioned one-half inch from a proximity sensor in communication with the switching apparatus.

Figure 12:
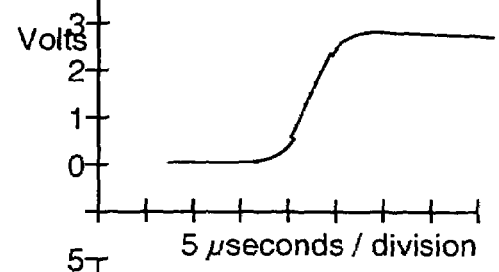
FIG. 12 is a graph of a filtered input to a processor of the switching apparatus with a gain setting set at maximum and a target positioned four inches from a proximity sensor in communication with the preferred embodiment of the switching apparatus.
Figure 13:
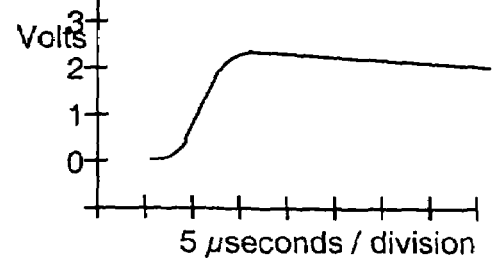
FIG. 13 is a graph of a filtered input to a processor of the switching apparatus with a gain setting set at minimum and a target positioned one-half inch from a proximity sensor in communication with the preferred embodiment of the switching apparatus.

Returning to FIG. 8A, diode 176, capacitor 178, and resistor 180 form a peak detector and smoothing filter for the filtered and amplified input signal. This detector circuit delivers a voltage which is read at pin RA0 of the microcontroller 98, which performs an A-to-D conversion on it. The output of the peak detector and smoothing filter is illustrated in FIGS. 12 and 13. FIG. 12 is a graph of a filtered input to a processor of the switching apparatus with a gain setting set at maximum and a target positioned four inches from a proximity sensor in communication with the switching apparatus. FIG. 13 is a graph of a filtered input to a processor of the switching apparatus with a gain setting set at minimum and a target positioned one-half inch from a proximity sensor in communication with the switching apparatus.

Figure 8B:
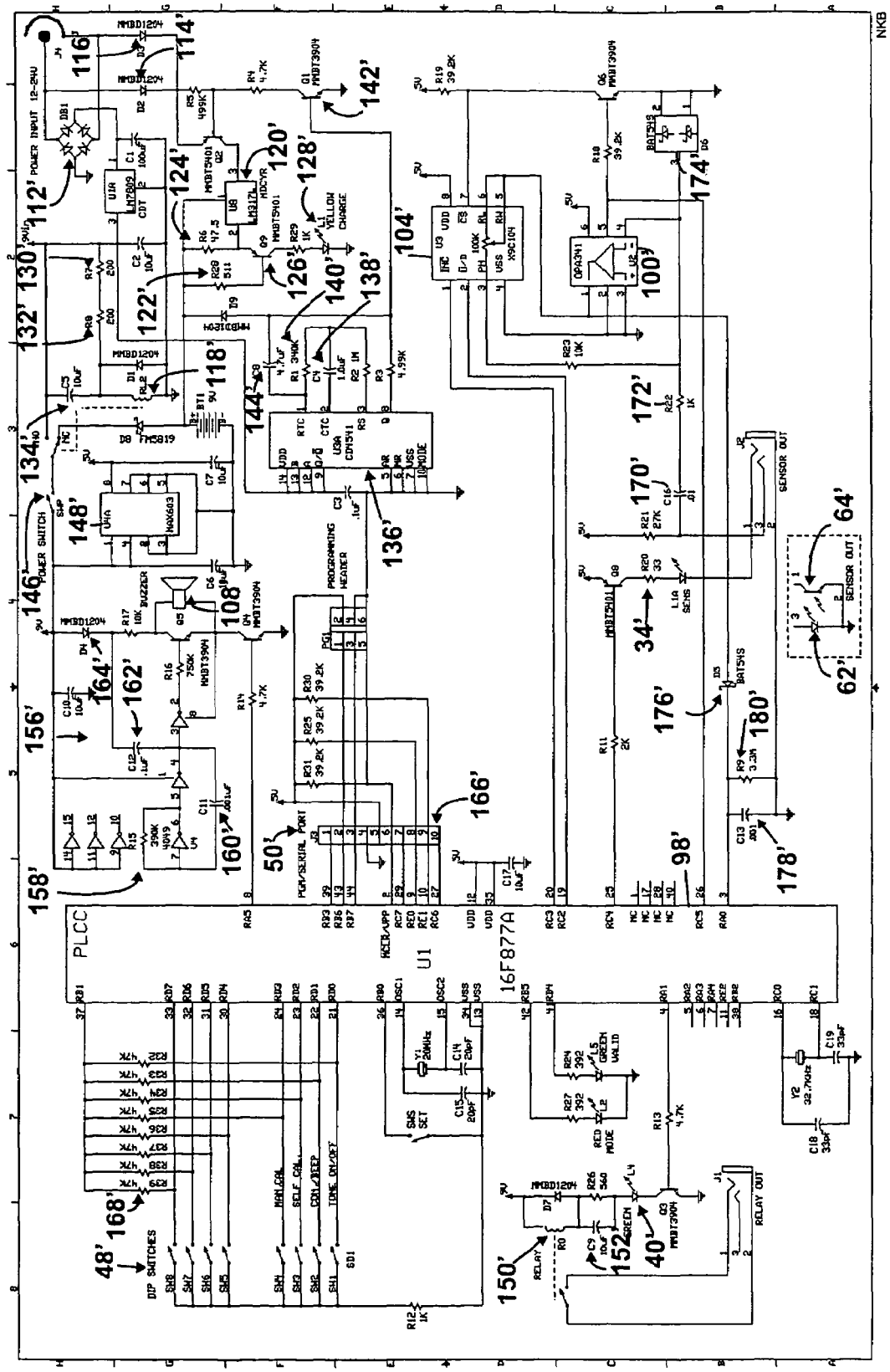
FIG. 8B is an electrical schematic of a second preferred embodiment of the switching apparatus in accordance with the present invention.
Figure 9:
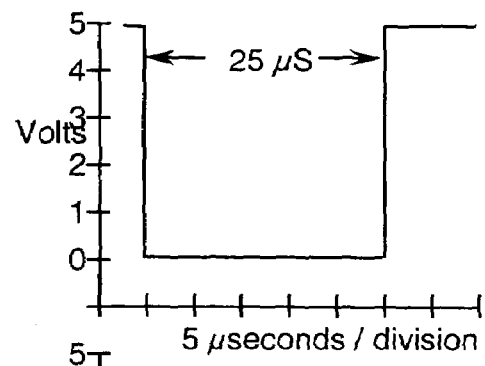
FIG. 9 is a graph of a driving pulse produced by the preferred embodiment of the switching apparatus.

Turning now to FIG. 8B, a bridge rectifier 112' provides for any polarity or AC power input for both charging and powering the switch. Diodes 114' and 116' prevent power feedback from the battery. When external power is present, relay 118' switches the battery out of the circuit. By removing the battery from the circuit through relay 118', a more accurate charging current (28 ma) can be maintained. This charging current is regulated by voltage regulator 120' (Lm317L) and resistors 122' and 124'. The PNP Transistor 126' is used to turn on the yellow LED 128' only when charging current is present. This verification that the battery is connected to the charging circuit helps troubleshoot poor battery snap connections. Resistors 130' and 132' and capacitor 134' reduce the power consumption of the coil in relay 118'. The power dissipation is distributed between the small surface-mount resistors 130' and 132'.

When power is first applied, the 16-bit CMOS binary counter 136' (CD4541) begins its timing cycle. The battery charging current is steady in this state and the yellow LED 128' glows continuously. Counter 136''s internal 16-bit counter begins counting the oscillation of capacitor 138' and resistor 140'. After one-half of this 16-bit timing cycle, pin 8 (Q) of the counter goes low. This turns off transistor 142' and stops the charging of the battery. Pin 8 will not go high again until a master reset or a new power-up occurs.

Capacitor 138' and resistor 140' continue to oscillate. This oscillation is coupled through capacitor 144' to turn on transistor and 142' with very brief pulses. These pulses are visible on LED 128'. These pulses help maintain the battery when left charging for extended periods. An external power switch 146' is located on the front panel of the switch apparatus enclosure, and is electronically situated between relay 118' and voltage regulator 148' (MAX603), which regulates the 9 volts to 5 volts for powering some of the switch circuitry.

Charging of the battery is completely automatic and does not require user intervention. An LED indicates the charging status, and shines steadily when charging. After charging is complete, the LED flashes on and off. This flashing also pulse-trickle charges the battery to keep it fully charged.

The Varta 9-volt nickel metal hydride (NiMH) rechargeable battery that is included with the switching apparatus has a fast charge rate of 28 ma for 7 hours. It is believed that this relatively low charging current does not produce the characteristic NiMH voltage knee (drop) that is typical at higher charging currents. This lack of detectable voltage change forces the charger design to be only current-and time-limited. It is further believed that the battery is not easily damaged by subjecting the battery to a charge time in excess of the 7 hours. Overcharging is determined only if it continues steadily for several days. Sequentially repeating two or three of the 7 hour charge cycles is not detrimental but should be avoided. This overcharging could only occur in the present design by a user purposely unplugging the charger after each 7 hour time period and restarting the charge. In this case, it would not damage the switch, but the battery would gradually lose some of its storage capacity.

The switching apparatus can be powered by any standard 9-volt rechargeable or non-rechargeable battery; the battery must be a true 9 volts, some rechargeable "9 volt" batteries are only 7.2 volts. The switch can be operated from the wall transformer without the battery installed. The wall transformer can be any polarity DC or AC voltage. Non-regulated wall transformers with voltage ratings from 12 volts to 24 volts can be used. A wheelchair battery (24 volts) can be used to operate the switch through the charger jack (J1). The charger circuit charges the 9-volt battery at the fast charge rate (7 hours to full charge). The charging current automatically shuts off after the battery is charged. An LED indicates the charging status. When lit constantly, the battery is being charged. When charging is completed the LED flashes. The battery is maintained at full charge indefinitely by these short charge pulses. To help verify a good connection to the battery, the LED only glows when the battery is installed and connected securely. In the present configuration the charger printed circuit board is configured to mount above the switch circuit board inside the enclosure.

The switch is portably powered by a single internal 9-volt rechargeable battery. This standard size battery can be replaced by most any brand 9-volt rechargeable or non-rechargeable battery. This feature allows an easy way for someone to quickly remedy a discharged battery problem. The switch can also be powered and charged by several types of external power sources connected to the charger jack. The internal circuit will power the switch in this mode with or without the battery in place. This feature enables use of the switch independent of battery condition or availability. This feature is also advantageous for powering from external power sources, such as wheelchair batteries or other power sources.

The output relay circuit 150' is shown in FIG. 8B. Using a relay to control the output insures compatibility with a wide variety of devices. The isolated contacts of the relay allow many voltage and polarity differences of the devices this switch can control. Pin RA1 of the microcontroller 98 turns the relay circuit 150' on and off. The green LED 40 provides the user with a visible feedback of the state of the relay. Capacitor 152' and resistor 154' provide power savings by reducing the current needed to hold the relay in the "on" state. The tone oscillator circuit 156' provides audio feedback to the user. A CD4049 hex inverter generates an audio signal with frequency determined by the values of resistor 158' and capacitor 160'. Capacitor 162' and diode 164' form a voltage-doubling circuit to drive piezo speaker output 108'.

A program/serial port 50' includes a 10-pin header 166', which provides a connection for reprogramming the microcontroller. This connector also provides the option for communicating through an external interface (USB or RS 232) to computers or other devices. This link can be used for other modes of input control, such as direct selection cursor control, mouse emulation, etc. Other controlled bits on this connector may be used for other types of communications protocols or future expansion.

DIP switch 48' is employed as a user interface device for mode selection. To save power, pull up resistors are only enabled when RB1 of microcontroller 98' is set high. The pull up resistors 168' are enabled only during a read of the status of the DIP switch. RB1 is cleared (set low) at all other times.

The remaining sensor and amplifier circuitry allow distance readings with a proximity sensor connected to the apparatus. The reading of the distance can be made by sending a single pulse from the infrared LED 62' and performing an A-to-D conversion of the amplified reflecting signal from the photo transistor 64'. A distance reading is initiated by pulsing bit RC4 of the microcontroller 98'. FIGS. 9-13 provide related timing diagrams. The width of this pulse is typically 25 microseconds. This width can be reduced to improve close-range sensitivity. At the end of this pulse, an A to D conversion is performed. Returning to FIG. 8B, red LED 34', in series with infrared LED 62,' provides the user with a visible confirmation that the switch is functioning.

The photo transistor 64' detects the reflected pulse. Capacitor 170' and resistor 172' form a high-pass filter to block environmental infrared noise. This filtered signal is amplified by op amp 100'. This single-supply op amp has rail-to-rail input and output which allows its +V input to be tied to ground, forming an inverting amplifier configuration. The filtered photo transistor signal is coupled to the −V input. Schottky diodes 174' clamp this voltage to keep it within usable limits. This clamp also protects the op amp from static charges. The gain of the op amp is controlled by gain control 104', a programmable digital potentiometer. This control gives the proximity switch a range of up to 5 inches. This computer-controlled gain helps to equalize the sensitivity over the full range. Typical output signals from the op amp 100 are plotted in FIGS. 10 and 11. FIG. 10 is a graph of an output from an op amp of the switching apparatus with a gain setting set at maximum and a target positioned four inches from a proximity sensor in communication with the switching apparatus. FIG. 11 is a graph of an output from an op amp of the switching apparatus with a gain setting set at minimum and a target positioned one-half inch from a proximity sensor in communication with the switching apparatus.

Returning to FIG. 8B, diode 176', capacitor 178', and resistor 180' form a peak detector and smoothing filter for the filtered and amplified input signal. This detector circuit delivers a voltage which is read at pin RA0 of the microcontroller 98', which performs an A-to-D conversion on it. The output of the peak detector and smoothing filter is illustrated in FIGS. 12 and 13. FIG. 12 is a graph of a filtered input to a processor of the switching apparatus with a gain setting set at maximum and a target positioned four inches from a proximity sensor in communication with the switching apparatus. FIG. 13 is a graph of a filtered input to a processor of the switching apparatus with a gain setting set at minimum and a target positioned one-half inch from a proximity sensor in communication with the switching apparatus.

In addition to being a switching apparatus or signal processing unit thereof, the present invention is also a system and method of detecting purposive signals. Such signals may be movements, changes in force, changes in reflectivity, or other property that can be controlled in a temporal pattern. Thus, the system typically detects purposive manipulation of signal strength, but it is envisioned that other signal characteristics may be employed in alternative embodiments, such as signal wavelength/frequency.

The preferred application of the present invention apparatus is in the design of proximity switches for use by physically challenged persons with limited motoric ability for control of assistive devices. Such a proximity switch can be operated by changes in distance between an activating surface (or target) and the sensor of the switch. This activating surface can be a finger, eyelid, eyebrow, facial muscles, or other body part under the user's control. The sensor can be a detector of light intensity, pressure, or other detectable signal source. Types of assistive devices that can be operated by the preferred embodiment of the switching apparatus include wheelchairs, speech synthesizers, alarms, computers, remote controls, and many others.

Figure 14:
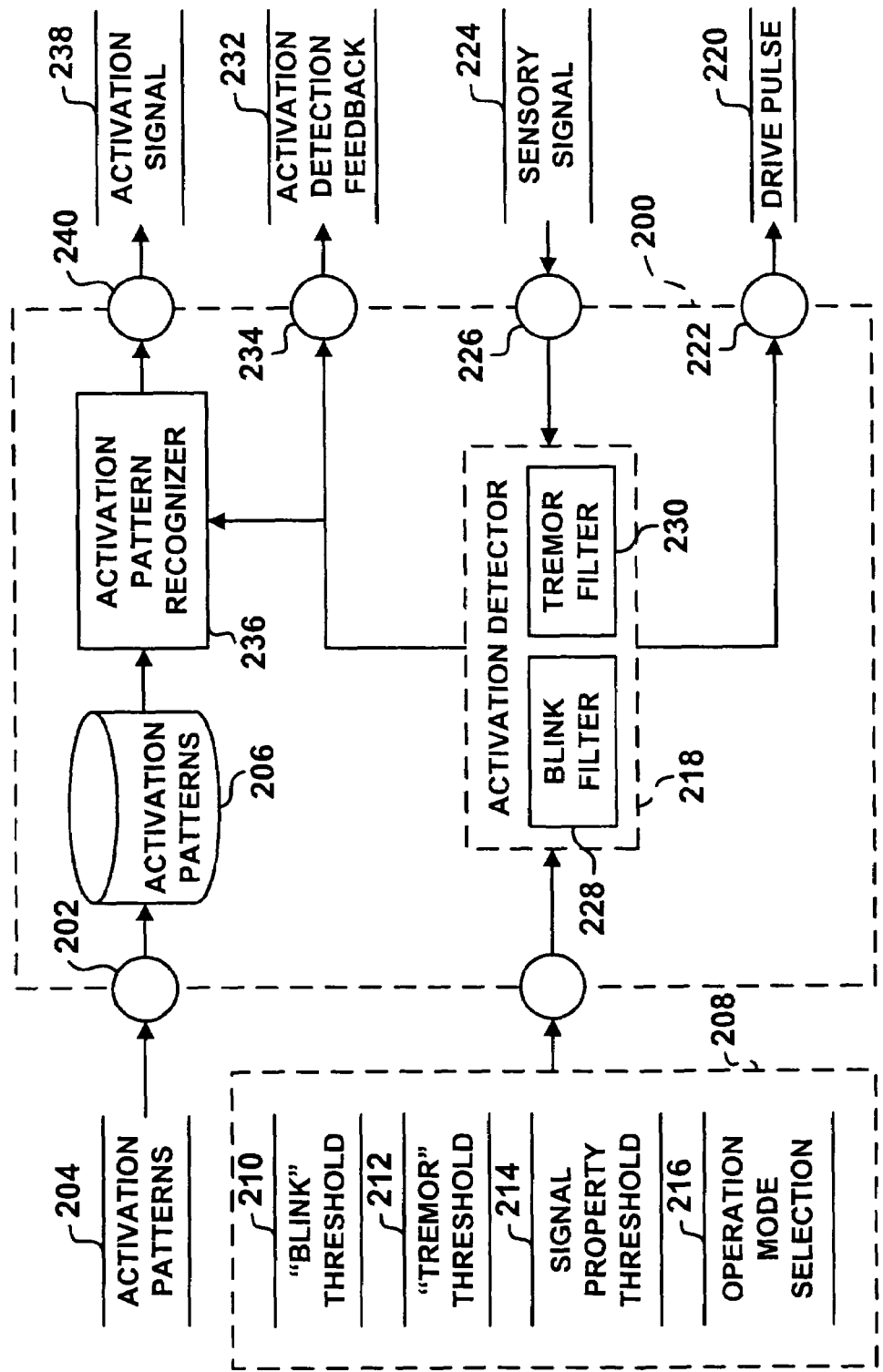
FIG. 14 is a block diagram illustrating a purposive switch activation detection system of the preferred embodiment switching apparatus in accordance with the present invention.

FIG. 14 illustrates the signal processing system 200 according to the present invention. Some embodiments may support pattern recognition as further explained below. In such cases, the signal processing system includes an input 202 of predefined activation patterns 204 having related output states. These patterns and states are stored in association with one another in system memory as datastore 206. Some embodiments also permit the user to provide input 208 specifying operation mode selections 216 and/or various sensitivity thresholds, such as gain applied to a received sensory input signal, a durational "blink" threshold 210, an immediacy "tremor" threshold 212, and a signal characteristic property threshold 214.

Some embodiments of system 200 have an activation detector 218 adapted to generate and transmit a drive pulse 220 via sensory output 222. A sensory signal 224 received via sensory input 226 is further processed by activation detector, which detects activations based on manipulations of a signal characteristic that is subject to manipulation by a user. Activation detector 218 employs one or more filters, such as a blink filter 228 and a tremor filter 230, to filter out non-purposive activations. Purposive activations result in activation detection feedback 232 to a user via feedback output 234. Depending on operation mode, purposive activations are either communicated to activation pattern recognizer 236 or relayed as activation signals 238 to an external device via output 240. In the case of pattern recognition, the purposive activations are recorded over time and compared to contents of datastore 206. Accordingly, Activation signals may be output states related to recognized activation patterns. Thus, output 240 may include a binary relay output, and/or a data port capable of conforming to more than two output states.

The detection of purposive signals by the method of the invention can be achieved in three ways: a "manual calibration" mode, a "self-calibration" mode, and a "pattern recognition" mode. For example, in its "manual calibration" mode, the activation distance from the target surface can be set using a manual control, such as a momentary contact switch pressed when the sensor is placed at the desired threshold distance. A potentiometer can serve as an alternative calibration control. When the sensor is placed at a distance greater than or equal to the activation distance, the switch is in the "off" state. If the sensor is moved to a distance less than the activation distance, the switch will change to its "on" state. Also, in its "self-calibration mode", the sensor continuously readjusts its triggering criteria automatically while in use to compensate for changes in the positioning of the sensor or other environmental variables affecting the signal detected at the sensor. Accordingly, the "on" state is triggered when the distance between the activating surface and the sensor is decreased rapidly. If this distance is rapidly increased, the switch enters its "off" state. The rate of change of the distance between the activating surface and the sensor needed to change the state of the switch can be adjusted. Further, in its "pattern-recognition mode", this switch can automatically learn to recognize a specific number of activations within a given time frame. The switch's output response will then be dependent on the detection of this pattern of activations. Stored patterns can be uploaded to and downloaded from other devices, including computers and other switches.

This invention allows the user to set two time constants which can help to filter out non-purposive signals while detecting purposive ones. These time constants are the "blink filter time constant" and the "tremor filter time constant". For example, the blink filter time constant is the minimal time required for activation. This time constant can be used to cause the switch to ignore short eye blinks as non-purposive artifacts while accepting longer eye blinks as purposive signals. Also, the tremor filter time constant is the minimal duration of non-activation before the next accepted activation. This time constant can be used, for example, to accept a purposive movement as a valid activation while ignoring subsequent involuntary trembling.

Figure 15:
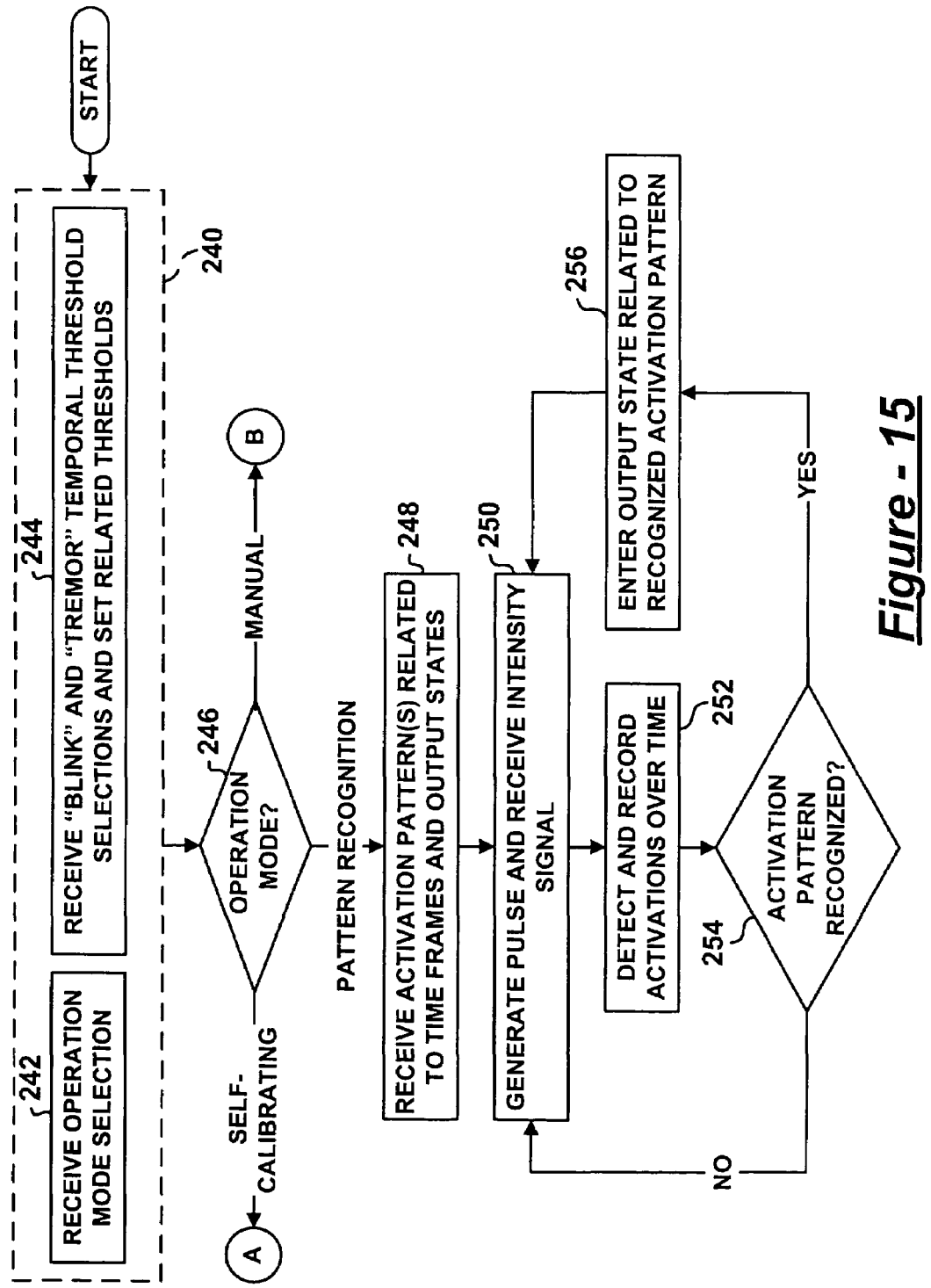
FIG. 15 is a flow diagram illustrating a method for detecting and using patterns of purposive switch activations of the preferred embodiment switching apparatus in accordance with the present invention.

FIG. 15 illustrates an example of operation of the signal processing system according to the signal processing method of the present invention. Accordingly, user input is received at step 240 that specifies operation mode selection in step 242 and various temporal thresholds in step 244. If pattern recognition mode is selected at decision step 246, then predefined activation patterns are received and stored at step 248. Then, purposive activations are detected according to a selected mode of detection, such as self-calibrating mode or manual calibration mode. Accordingly, pulses are generated and signals received at step 250, and purposive activations are detected and recorded over time at step 252. Received activation patterns are compared to pre-stored activation patterns at decision step 254 by employing a pattern recognition technique, such as dynamic time warping. Recognized activation patterns result in transmission of output states related to the recognized patterns at step 256. It is envisioned that users may be allowed to define their own recognition patterns for a specified output, and that various types of recognition techniques may be employed to transmit predefined and/or customized outputs.

Figure 16:
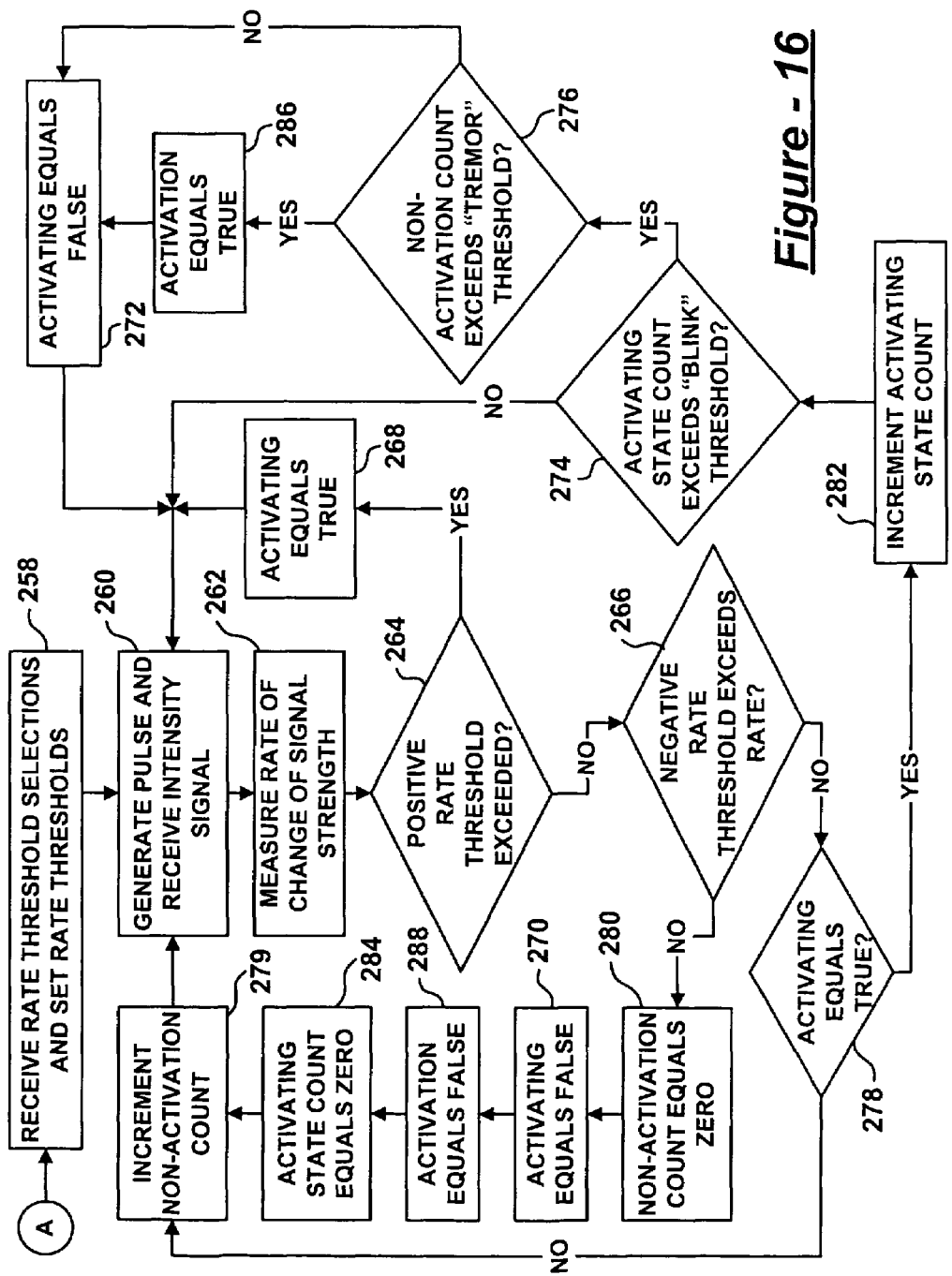
FIG. 16 is a flow diagram illustrating a method of detecting purposive switch activations in a self-calibrating mode of the preferred embodiment switching apparatus in accordance with the present invention.

An example of purposive activation detection according to the self-calibrating mode of the present invention is detailed in FIG. 16 that includes the "blink" filter and the "tremor" filter. It is envisioned that the filters may be used alone in some embodiments, and used in combination in others. While the "blink" filter generally requires tracking of an amount of time that an activation lasts, it is envisioned that the "tremor" filter can be accomplished with or without tracking an amount of time. For example, the signal processor may be adapted to cease generating drive pulses for a given amount of time following a purposive activation or any activation to prevent detection of further activations for the given amount of time. Equivalently, a gain applied to the received signal may be reduced for the given amount of time, or a signal characteristic property threshold may be temporarily adjusted for the given amount of time. These techniques, however, render the switch "blind" for the given amount of time, and make it unable to adjust for bouts of tremor of varying duration. For example, a user often experiencing bouts of tremor of short duration and occasionally experiencing bouts of tremor of lengthy duration must select a lengthy "tremor" threshold to filter out both the short and long bouts of tremor. However, if the switch continuously monitors activation attempts and tracks time since a last activation, whether purposive or non-purposive (i.e., since opening of the eye) to filter out tremors, then a relatively short "tremor" threshold can filter out bouts of tremor of varying duration. The method described in FIG. 16, therefore, demonstrates continuous tracking of the signal, but it should be readily understood that causing the switch to go "blind" for a given amount of time is also within the scope of the present invention.

Self-calibrating mode includes receiving and setting signal characteristic property thresholds at step 258. In the case of proximity detection, signal strength is proportional to reflected light intensity, and therefore proximity. Accordingly, the signal characteristic is signal strength in the following examples. In the case of self-calibrating mode, the rate of change of the signal strength is the property of the signal characteristic that is employed to detect purposive manipulation of the signal strength. Accordingly, the thresholds received at step 258 correspond to positive and negative rate thresholds. These thresholds may be employed to detect closing and opening of the eye, respectively. Thus, training the light on the white region of the eye, followed by closing of the eye, results in a measurable increase in signal strength, while opening of the eye decreases signal strength. Accordingly, pulses are generated and signals received at step 260, and the signal strength is sampled and recorded over time. The rate of change of the signal strength is measured based on the slope of the recorded sample strengths at step 262. Closing of the eye is detected at decision step 264 by comparing the rate of change to the positive rate threshold. Conversely, opening of the eye is detected at step 266 by comparing the rate of change to the negative rate threshold.

When closing of the eye is detected at step 264, a variable called "activating" is set to true at step 268. This variable is reset to false at step 270 as soon as the eye as detected to be closing. This variable can also be set to false even if the eye is still closed at step 272 if a purposive activation is already detected at decision steps 274 and 276, or if the "tremor" threshold indicates at decision step 274 that the eye is closed as the result of a tremor. Thus, if neither closing nor opening of the eye is detected at steps 264 and 266, then decision step 278 determines how the method proceeds for a given sample processing cycle based on whether or not the eye is closed and either not yet activated or else not yet determined to be ineligible to activate. Thus, if the eye is deemed open, closed as the result of a tremor, or closed but already activated, then a non-activation count variable is incremented at step 279, and processing returns to step 260. When the eye opens from the closed state at step 266, this count is reset to zero at step 280. Thus, even though the non-activation count is sometimes incremented when the eye is closed, it is not compared to a temporal threshold at step 276 unless the eye has closed from an open position for longer than a "blink". Thus, the non-activation count actually tracks an amount of time between opening and subsequent closing of the eye. It is envisioned, however, that the non-activation count can be constantly incremented, with reset to zero occurring when the eye opens. In this case, the non-activation count can track the amount of time since the eye opened until the activating state count exceeds the "blink" threshold at step 274.

When closing of the eye is detected at step 264, then "activating" is set to true at step 268 and processing returns to step 260. While the eye remains closed thereafter, an "activating state" count variable is incremented at step 282. Recursive comparison of the "activating state count to the "blink" threshold at step 274 prevents the activation from being deemed purposive for several cycles. If the reopening of the eye is detected at step 266 before the "blink" threshold is exceeded, then the activating state count is reset to zero at step 284, and "activating" is reset to false at step 270. However, if the eye remains closed long enough, then the "blink" threshold will eventually be exceeded. Then, the non-activation count that incremented while the eye was open is compared to the "tremor" threshold at step 276 to determine whether or not the eye is closed due to a tremor. If not, then an "activation" variable is set to true at step 286, resulting in detection of a purposive activation. In either case, the "activating" variable is reset to false at step 272. The "activation" variable then remains set to true until reset to false at step 288 as a result of detection of the eye opening at step 266. In essence, the user can toggle between an activation and a non-activation state, where setting of the activation flag to false is equivalent to detecting a non-activation, thereby undetecting the activation. Thus, the user can accomplish purposive activations of varying lengths for pattern recognition, and recognition can adjust for periods of tremor. One example of such adjustment may be reduction of cost for matching over a period of tremor during a dynamic time warping process.

Figure 17:
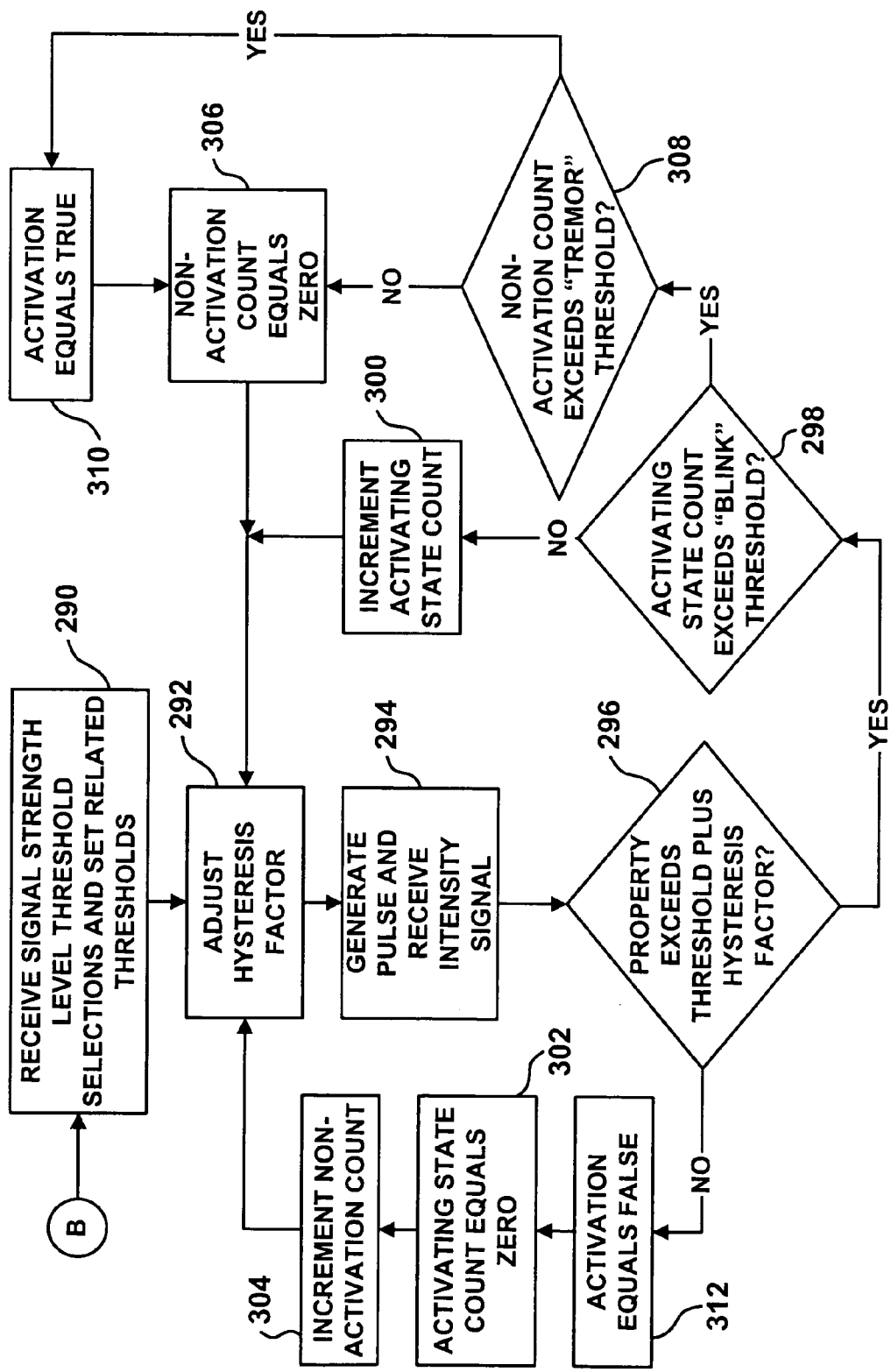
FIG. 17 is a flow diagram illustrating a method of detecting purposive switch activations in a manual calibration mode of the preferred embodiment switching apparatus in accordance with the present invention.

Another example of purposive activation detection according to the manual calibration mode of the present invention is detailed in FIG. 17. This example also includes the "blink" filter and the "tremor" filter. Once again, it is envisioned that these filters may be used separately or in combination, and that the tremor filter may use the "go blind" technique or track time since opening of the eye or some other event. The continuous time tracking case is once again illustrated.

The manual calibration mode begins with receiving and storing signal characteristic property thresholds, such as signal strength level, at step 290. Then a hysteresis factor is adjusted at step 292 based on signal strength level to accommodate for hysteresis in the phototransistor. Next, pulses are generated and signals received at step 294. Then, the signal strength level is compared to the threshold at decision step 296 to determine whether the eye is in a closed position or an open position. The closed position equates to relatively high signal strength level. Thus, if the signal strength level exceeds the threshold, then an activating state count variable is recursively compared to the "blink" threshold at decision step 298, and the activating state count is recursively incremented at step 300 until it either exceeds the "blink" threshold at decision step 298 or is reset to zero at step 302 as a result of detection the eye in an open state at step 296. The hysteresis factor is dynamically adjusted at step 292 as the signal strength changes.

A non-activation count is incremented at step 304 only when the eye is in an open state, and the non-activation count is reset to zero at step 306 whenever the eye is closed longer than for a "blink". Thus, once the activating state count exceeds the "blink" threshold at decision step 298, the non-activation count is compared to the "tremor" threshold at decision step 308 to determine if the relatively lengthy closing of the eye is purposive or the result of tremor. Detection of purposive, lengthy closing of the eye results in setting of an "activation" variable to true at step 310. Once the eye reopens, the "activation" variable is reset to false at step 312.

In various preferred embodiments, activation detector 218 (FIG. 14) typically takes a reading when not in use by generating infrared pulses of approximately 20 microseconds duration at a rate of approximately 1 pulse per second. It does so by driving an emitter of the sensor at an approximate maximum of 20 ma. Then, when a change in intensity or a rate of change in intensity exceeds a user-adjustable threshold, the detector 218 generates the pulses at a faster rate of about 10 to 100 times per second. This processing is performed in steps 250 (FIG. 15), 260 (FIG. 16), and 294 (FIG. 17). The same pulse intensity and pulse duration as above are employed during the faster reading rate. Depending on the needs of the user or the mode of operation in question, the faster reading rate is maintained for about 5 seconds or even longer if a user specifies a longer time to maintain the faster rate. During the faster reading rate, many readings are taken and averaged together to obtain a rate of change in intensity.

During the slower reading rate, most blinks will not be detected at all, so the faster reading rate will initialize by accident only on occasion. The user can initialize the faster reading rate by blinking two or more times in rapid succession. Then, the user can signal activations through purposive winks, blink patterns, or other controlled eye movements. Use of the slower reading rate when the device is not being used results in a substantial savings of power and may have other advantages.

The description of the invention is merely exemplary in nature and, thus, variations that do not depart from the gist of the invention are intended to be within the scope of the invention. For example, this invention can be marketed as a control device for persons with limited motoric abilities. It can also be used as an input switch for communication systems that require a momentary contact switch for signaling, such as row-and-column scanning devices or Morse-code-based communication systems. It can further be used to detect vibrations of a known pattern, such as the vibration of the suspension system of a car traveling on a given surface at a given velocity. It can still further be used to detect biological signs such as breathing. It can yet further be used in assembly-line monitoring to detect abnormalities in the surfaces of objects in motion past the sensor.

Moreover, the filtering techniques of the invention are not limited to those illustrated in FIGS. 16 and 17. For example, FIG. 16 illustrates a tremor filter that tracks time since last opening of the eye including "blinks". Conversely, FIG. 17 illustrates a tremor filter that tracks time since last opening of the eye excluding "blinks". It is envisioned, however, that these techniques may be modified in various ways, and that alternative and additional tests and flags may be used to track time between various events, such as closed due to tremor versus closed due to blink, versus purposively closed, and respond according to designer and/or user preference.

Finally, it is envisioned that the present invention can take many forms and have various uses, including vehicles, residences, publicly accessible terminals, and manufacturing equipment adapted to monitor environment, monitor behavior, accept user input, and inspect physical features of objects. Such variations are not to be regarded as a departure from the spirit and scope of the invention.

What is claimed is:

1. A signal processing system for detecting purposive signals, comprising:
    an input receiving a signal having a signal characteristic subject to user manipulation;
    an activation detector comparing a property of the signal characteristic to at least one signal characteristic property threshold over time, wherein the activation detector is adapted to measure the property as signal strength level, determine a rate of change of the signal strength level, and detects activations and deactivations by comparing the rate of change of the signal strength level to predetermined rate of change thresholds; and
    a filter module determining whether the signal characteristic is purposively manipulated based on an amount of time between an activation and a deactivation.

2. The system of claim 1, wherein the filter module is adapted to filter out signal characteristic manipulations having too short a duration as non-purposive signal characteristic manipulations.

3. The system of claim 1, wherein the filter module is adapted to filter out signal characteristic manipulations having too great an immediacy following a previous signal characteristic manipulation as non-purposive signal characteristic manipulations.

4. The system of claim 1, wherein the filter module is adapted to determine that the activation is purposive in response to a determination that the amount of time between the activation and the deactivation exceeds a first predetermined temporal threshold.

5. The system of claim 4, wherein the filter module is adapted to determine that another activation following the deactivation is not purposive in response to a determination that an amount of time between the deactivation and the other activation falls below a second predetermined temporal threshold.

6. The system of claim 4, further comprising:
    a first datastore of activation patterns having related output states for supplying a control signal to a user interface;
    a second datastore of purposive manipulations recorded over time as activations;
    a pattern recognition module performing pattern recognition on the activations based on the activation patterns; and
    an output mechanism entering the related output states of recognized activation patterns.

7. A signal processing system for detecting purposive signals, comprising:
    an input receiving a signal having a signal characteristic subject to user manipulation;
    an activation detector comparing a property of the signal characteristic to at least one signal characteristic property threshold over time;
    a filter module determining whether the signal characteristic is purposively manipulated based on an amount of time at least one of preceding or following an occurrence of the property at least one of exceeding or falling below at least one signal characteristic property threshold;
    a first datastore of activation patterns having related output states;
    a second datastore of purposive manipulations recorded over time as activations;
    a pattern recognition module performing pattern recognition on the activations based on the activation patterns; and
    an output mechanism entering related output states of recognized activation patterns.

8. A method for detecting purposive signals, comprising:
    receiving a signal having a signal characteristic;
    comparing a property of the signal characteristic to at least one signal characteristic property threshold over time, including measuring a property of the signal characteristic as a signal strength level;
    determining a rate of change of the signal strength level;
    detecting activations and deactivations by comparing the rate of change of the signal strength level to predetermined rate of change thresholds; and
    determining whether the signal characteristic is purposively manipulated by a user based on an amount of time between an activation and a deactivation.

9. The method of claim 8, further comprising filtering out signal characteristic manipulations having too short a duration as non-purposive signal characteristic manipulations.

10. The method of claim 8, further comprising filtering out signal characteristic manipulations having too great an immediacy following a previous signal characteristic manipulation as non-purposive signal characteristic manipulations.

11. The method of claim 8, further comprising:
    accessing a datastore of activation patterns having related output states;
    detecting and recording purposive manipulations over time as activations;
    performing pattern recognition on the activations based on the activation patterns; and
    transmitting related output states of recognized activation patterns.

12. The method of claim 8, further comprising:
    comparing the amount of time to a first predetermined threshold; and
    determining that the activation is purposive in response to a determination that the amount of time between the activation and the deactivation exceeds a first predetermined temporal threshold.

13. The method of claim 12, further comprising:
    comparing another amount of time between the deactivation and another activation following the deactivation to a second predetermined temporal threshold; and
    determining that the other activation is not purposive in response to a determination that an amount of time between the deactivation and the other activation falls below the second predetermined temporal threshold.

14. The method of claim 12, further comprising:
    accessing a first datastore of activation patterns having related output states for supplying a control signal to a user interface;
    accessing a second datastore of purposive manipulations recorded over time as activations;
    performing pattern recognition on the activations based on the activation patterns; and
    causing an output mechanism to enter the related output states of recognized activation patterns.

15. A signal processing apparatus for detecting purposive signals, comprising:
- an input port receiving a signal having a signal characteristic subject to user manipulation;
- an output mechanism selectively entering one or more of a plurality of output states in response to one or more purposive manipulations of the signal characteristic; and
- a controller operably connecting said input port and said output mechanism by:
  - measuring a property of the signal characteristic as a signal strength level;
  - determining a rate of change of the signal strength level;
  - detecting activations and deactivations by comparing the rate of change of the signal strength level to predetermined rate of change thresholds; and
  - determining whether the signal characteristic is purposively manipulated based on an amount of time between an activation and a deactivation.

16. The apparatus of claim 15, wherein said controller is operably connected to filter out signal characteristic manipulations having too short a duration as non-purposive signal characteristic manipulations.

17. The apparatus of claim 15, wherein said controller is operably connected to filter out signal characteristic manipulations having too great an immediacy following a previous signal characteristic manipulation as non-purposive signal characteristic manipulations.

18. The signal processing apparatus of claim 15, wherein the controller determines that the activation is purposive in response to a determination that the amount of time between the activation and the deactivation exceeds a first predetermined temporal threshold.

19. The signal processing apparatus of claim 18, wherein the controller determines that another activation following the deactivation is not purposive in response to a determination that an amount of time between the deactivation and the other activation falls below a second predetermined temporal threshold.

20. The signal processing apparatus of claim 18, further comprising:
- a first datastore of activation patterns having related output states for supplying a control signal to a user interface;
- a second datastore of purposive manipulations recorded over time as activations;
- a pattern recognition module performing pattern recognition on the activations based on the activation patterns; and
- an output mechanism entering the related output states of recognized activation patterns.

21. A signal processing apparatus for detecting purposive signals, comprising:
- an input port receiving a signal having a signal characteristic subject to user manipulation;
- an output mechanism selectively entering one or more of a plurality of output states in response to one or more purposive manipulations of the signal characteristic; and
- a controller operably connecting said input port and said output mechanism by:
  - (a) comparing a property of the signal characteristic to at least one signal characteristic property threshold over time;
  - (b) determining whether the signal characteristic is purposively manipulated based on an amount of time at least one of preceding or following an occurrence of the property at least one of exceeding or falling below at least one signal characteristic property threshold;
- a first datastore of activation patterns having related ones of said output states; and
- a second datastore of purposive manipulations recorded over time as activations,
- wherein said controller is operably connected:
  - (a) to record the purposive manipulations in said second datastore;
  - (b) to access said first datastore and said second datastore to perform pattern recognition on the activations based on the activation patterns; and
  - (c) to instruct said output mechanism to enter related output states of recognized activation patterns.

* * * * *